United States Patent
Tuan et al.

(10) Patent No.: US 10,034,418 B1
(45) Date of Patent: *Jul. 24, 2018

(54) CONCRETE MIX FOR SHOTCRETE APPLICATIONS FOR ELECTROMAGNETIC SHIELDING

(71) Applicant: NUtech Ventures, Lincoln, NE (US)

(72) Inventors: Christopher Tuan, Omaha, NE (US); Lim Nguyen, Bellevue, NE (US)

(73) Assignee: NUtech Ventures, Lincoln, NE (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/343,786

(22) Filed: Nov. 4, 2016

Related U.S. Application Data

(60) Provisional application No. 62/250,794, filed on Nov. 4, 2015.

(51) Int. Cl.
*H05K 9/00* (2006.01)
*C04B 14/00* (2006.01)
(Continued)

(52) U.S. Cl.
CPC ......... *H05K 9/0003* (2013.01); *C04B 14/022* (2013.01); *C04B 14/36* (2013.01);
(Continued)

(58) Field of Classification Search
CPC .. H05K 9/0003; H05K 9/0088; H05K 9/0069; H05K 9/009; C04B 28/04;
(Continued)

(56) References Cited

U.S. PATENT DOCUMENTS 2,334,355 A   11/1943   Russell
2,868,659 A   1/1959   Scripture, Jr. et al.
(Continued)

FOREIGN PATENT DOCUMENTS

CN   1552657 A   12/2004
CN   101030454 A   9/2007
(Continued)

OTHER PUBLICATIONS

Cao, Jingyao et al., "Use of fly ash as an admixture for electromagnetic interference shielding", Cement and Concrete Research, 34 (2004), pp. 1889-1892.
(Continued)

*Primary Examiner* — Jeanette E Chapman
(74) *Attorney, Agent, or Firm* — Harness, Dickey & Pierce, P.L.C.

(57) ABSTRACT

Conductive concrete mixtures for shotcrete applications are described that are configured to provide varied EM shielding and reflect and/or absorb, for instance, EM waves propagating through the conductive concrete mixture, while providing flowability (e.g., fluidity) for shotcrete applications. The conductive concrete mixtures include cement, aggregate, water, metallic conductive material, and conductive carbon particles and magnetic material. The metallic conductive material may include steel fibers and/or shavings having sizes suitable for application through shotcrete nozzles/applicators, and the magnetic material may include a taconite aggregate, such as taconite sand.

15 Claims, 11 Drawing Sheets

(51) Int. Cl.
 *C04B 28/04* (2006.01)
 *C04B 14/36* (2006.01)
 *C04B 14/48* (2006.01)
 *C04B 14/02* (2006.01)
 *C04B 103/00* (2006.01)
 *C04B 111/94* (2006.01)
 *C04B 111/00* (2006.01)

(52) U.S. Cl.
 CPC .............. *C04B 14/48* (2013.01); *C04B 28/04* (2013.01); *H05K 9/009* (2013.01); *H05K 9/0069* (2013.01); *H05K 9/0088* (2013.01); *C04B 2103/0027* (2013.01); *C04B 2111/00258* (2013.01); *C04B 2111/94* (2013.01)

(58) Field of Classification Search
 CPC ....... C04B 14/36; C04B 14/022; C04B 14/48; C04B 2103/0027; C04B 2111/94; C04B 2111/00258
 See application file for complete search history.

(56) References Cited

U.S. PATENT DOCUMENTS

| | | | |
|---|---|---|---|
| 3,207,705 | A | 9/1965 | Hall |
| 3,309,196 | A * | 3/1967 | Kaneko ................. C21C 7/076 148/26 |
| 3,475,304 | A | 10/1969 | Currey |
| 3,721,058 | A | 3/1973 | Dewey, Jr. et al. |
| 5,312,526 | A | 5/1994 | Miller |
| 5,346,547 | A | 9/1994 | McCormack |
| 5,392,580 | A | 2/1995 | Baumann |
| 5,422,174 | A | 6/1995 | Shintani et al. |
| 6,214,454 | B1 | 4/2001 | Kanda et al. |
| 6,461,424 | B1 * | 10/2002 | Ramme ................. C04B 18/08 106/709 |
| 6,503,318 | B2 | 1/2003 | Pye et al. |
| 6,821,336 | B1 | 11/2004 | Ramme et al. |
| 6,825,444 | B1 | 11/2004 | Tuan et al. |
| 7,578,881 | B2 | 8/2009 | Ramme |
| 8,067,084 | B2 | 11/2011 | Yoshikawa et al. |
| 8,617,309 | B1 | 12/2013 | Carney et al. |
| 8,968,461 | B1 | 3/2015 | Tuan et al. |
| 9,278,887 | B1 | 3/2016 | Tuan et al. |
| 9,681,592 | B2 * | 6/2017 | Tuan .................... H05K 9/0003 |
| 2002/0162484 | A1 * | 11/2002 | Ramme ................. C04B 18/08 106/705 |
| 2007/0039277 | A1 | 2/2007 | Mossbeck |
| 2012/0227630 | A1 | 9/2012 | Gray |
| 2012/0324811 | A1 | 12/2012 | Kawase et al. |
| 2016/0234977 | A1 | 8/2016 | Tuan et al. |

FOREIGN PATENT DOCUMENTS

| | | |
|---|---|---|
| CN | 102219447 A | 10/2011 |
| CN | 102444070 A | 5/2012 |
| CN | 102674881 A | 9/2012 |
| CN | 102869132 A | 1/2013 |
| CN | 102875090 A | 1/2013 |
| JP | 06240843 A | 8/1994 |
| JP | H07157356 A | 6/1995 |
| WO | 0240799 A1 | 5/2002 |
| WO | 2010059169 A1 | 5/2010 |
| WO | 2013096990 A1 | 7/2013 |
| WO | 2014210007 A1 | 12/2014 |
| WO | WO 2014210007 A1 * | 12/2014 |

OTHER PUBLICATIONS

Yehia, S. et al., "Conductive Concrete for Electromagnetic Shielding Applications", Advances in Civil Engineering Materials, vol. 3, No. 1, Published May 2, 2014 (Abstract Only).

Zhang, X. et al., "Electromagnetic shielding and absorption properties of fiber reinforced cementitious composites", Wuhan Univ. Technology, Material Science Edit. (2012) 27:172 doi:10.1007/s11595-012-0430-6 (Abstract Only).

Chinese Office Action for Application No. 201480046827.4 dated Oct. 10, 2017; 9 pages.

Construction Methods and Skills of Concrete Engineering Site Construction dated May 31, 2009; 10 pages.

Calculation of Shielding Effectiveness of Metal Wire Mesh of Cable dated Feb. 28, 2010; 5 pages.

Electromagnetic shielding concrete and developing trend dated Oct. 31, 2004; 4 pages.

English Translation of Office Action dated Jan. 25, 2017 from Chinese Patent Office for Chinese Patent Application No. 201480046827.4; 7 pages.

Notification of Transmittal of the International Search Report and the Written Opinion of the International Searching Authority for PCT Application No. PCT/US2014/043875, dated Oct. 14, 2014.

* cited by examiner

CONCRETE MIX FOR SHOTCRETE APPLICATIONS FOR ELECTROMAGNETIC SHIELDING

BACKGROUND

An Electromagnetic Pulse (EMP) is an abrupt pulse or burst of electromagnetic (EM) radiation that typically results from a high energy nuclear explosion interacting with the earth's atmosphere, or from a suddenly fluctuating magnetic field, such as a geomagnetic disturbance generated by a solar flare or coronal mass ejection (CME). An EMP creates rapidly changing electric fields and magnetic fields, which may couple with electrical and electronic systems, resulting in damaging current and voltage surges. In addition to protection from a broad range of physical threats, electronic equipment needs shielding from terrestrial intentional electromagnetic interference (IEMI) devices and confidential electronic data needs to be secured from espionage and eavesdropping derived from equipment emanations.

SUMMARY

As described herein, Electromagnetic Shielding Shotcrete (EMSS) is an effective electromagnetic (EM) shielding construction process configurable to meet varied electromagnetic shielding and physical protection requirements.

Conductive concrete mixtures for shotcrete applications are described that are configured to provide EM shielding and reflect and/or absorb, for instance, EM waves propagating through the conductive concrete mixture, while providing flowability (e.g., fluidity) for shotcrete applications. In some implementations, the conductive concrete mixture, when applied in multiple layers over a structure, can increase physical protection including the blast resistance and extreme weather of the structure. The conductive concrete mixtures include cement, aggregate, water, metallic conductive material, and conductive carbon particles and/or magnetic material. The metallic conductive material may include steel fibers and/or shavings having sizes suitable for application through shotcrete nozzles/applicators, and the magnetic material may include a fine taconite aggregate, such as taconite sand. The conductive concrete mixture may also include graphite powder, silica fume, and/or other supplementary cementitious materials (SCM) such as fly ash, calcined clay, and ground granular blast furnace slag (GGBFS). In one or more implementations, the conductive concrete is formed from a concrete mixture that comprises cement having approximately fourteen percent (14%) to approximately eighteen (18%) of the concrete mixture by weight, fine taconite aggregate material having from approximately thirty-five percent (35%) to approximately fifty-five (55%) of the concrete mixture by weight, coke breeze having from approximately five percent (5%) to approximately thirty percent (30%) of the concrete mixture by weight, and metallic conductive material. The metallic conductive material may comprise steel fibers having a maximum size of one inch (1 inch) and/or shavings.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The Detailed Description is described with reference to the accompanying figures. The use of the same reference numbers in different instances in the description and the figures may indicate similar or identical items.

Figure 9:
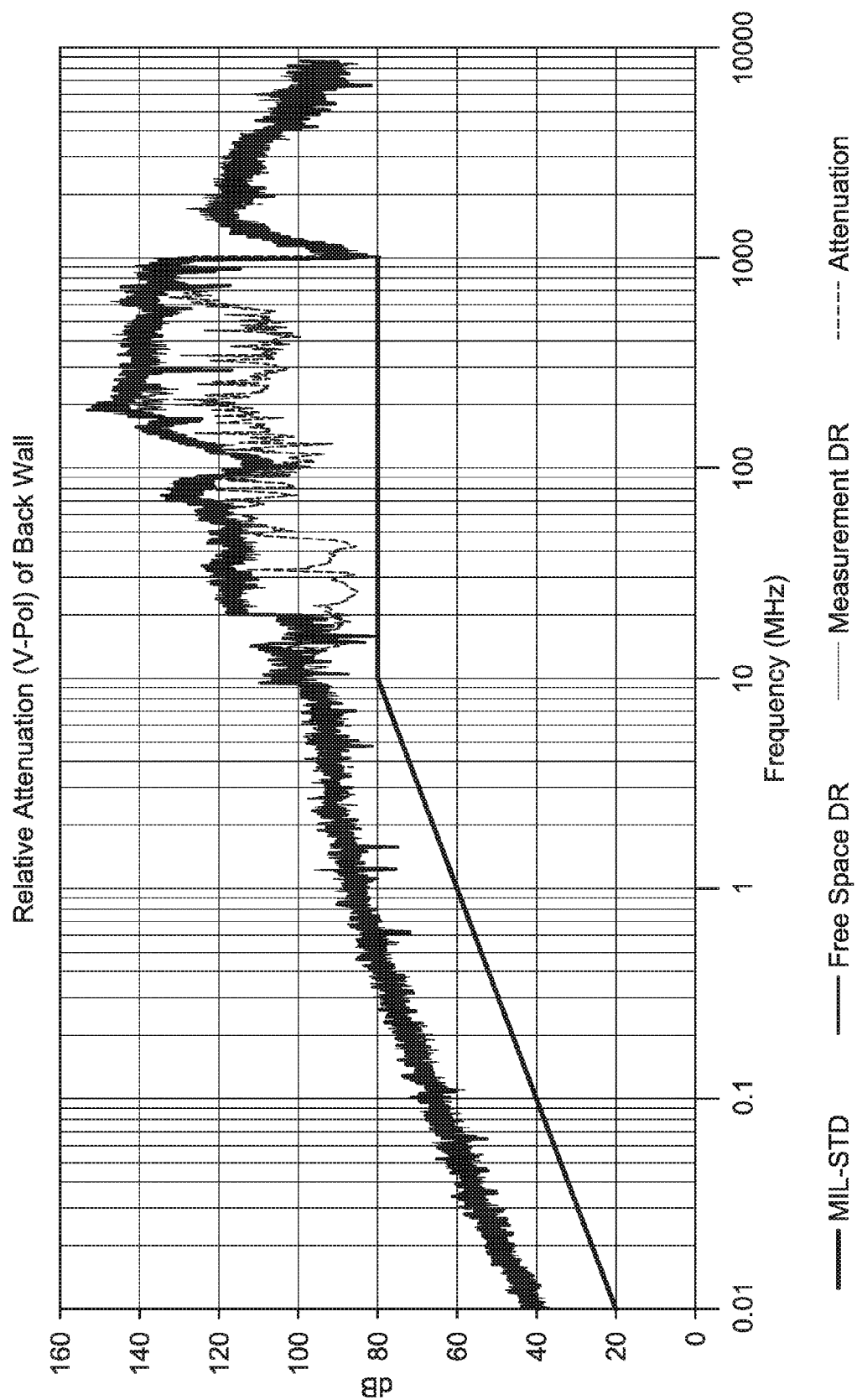

FIG. 9 is a graph illustrating an attenuation plot of an EM signal over a frequency range with respect to a portion of a concrete structure constructed from the conductive concrete mixture as well as the relative attenuation of an EM signal where the conductive concrete structure employs additional shotcrete applied to the conductive layers (e.g., metal panels) of the conductive concrete structure.

Figure 10:
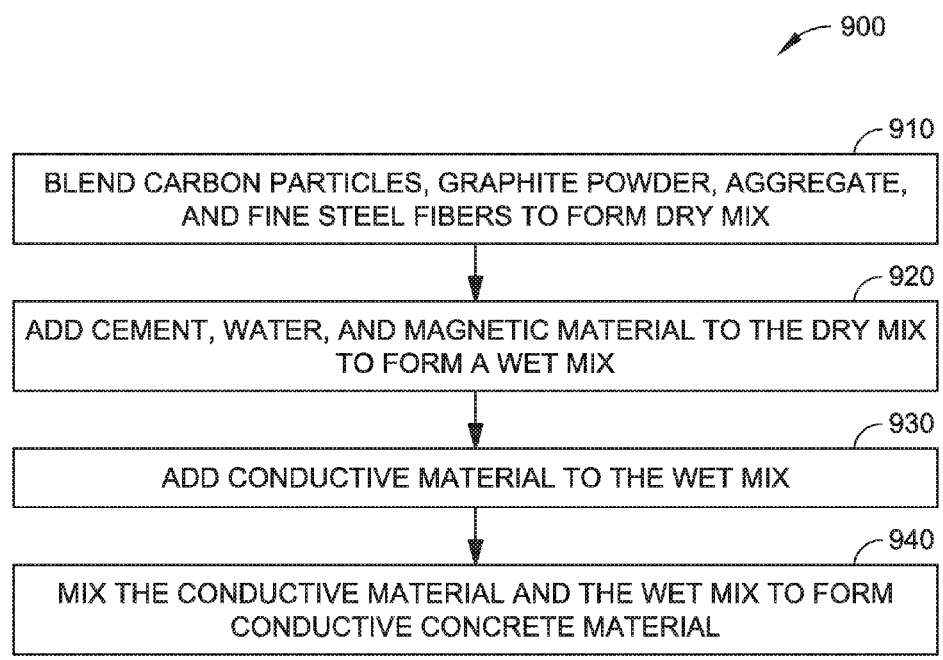

FIG. 10 is a flow diagram illustrating a method for making a conductive concrete mixture in accordance with example implementations of the present disclosure.

Figure 11:
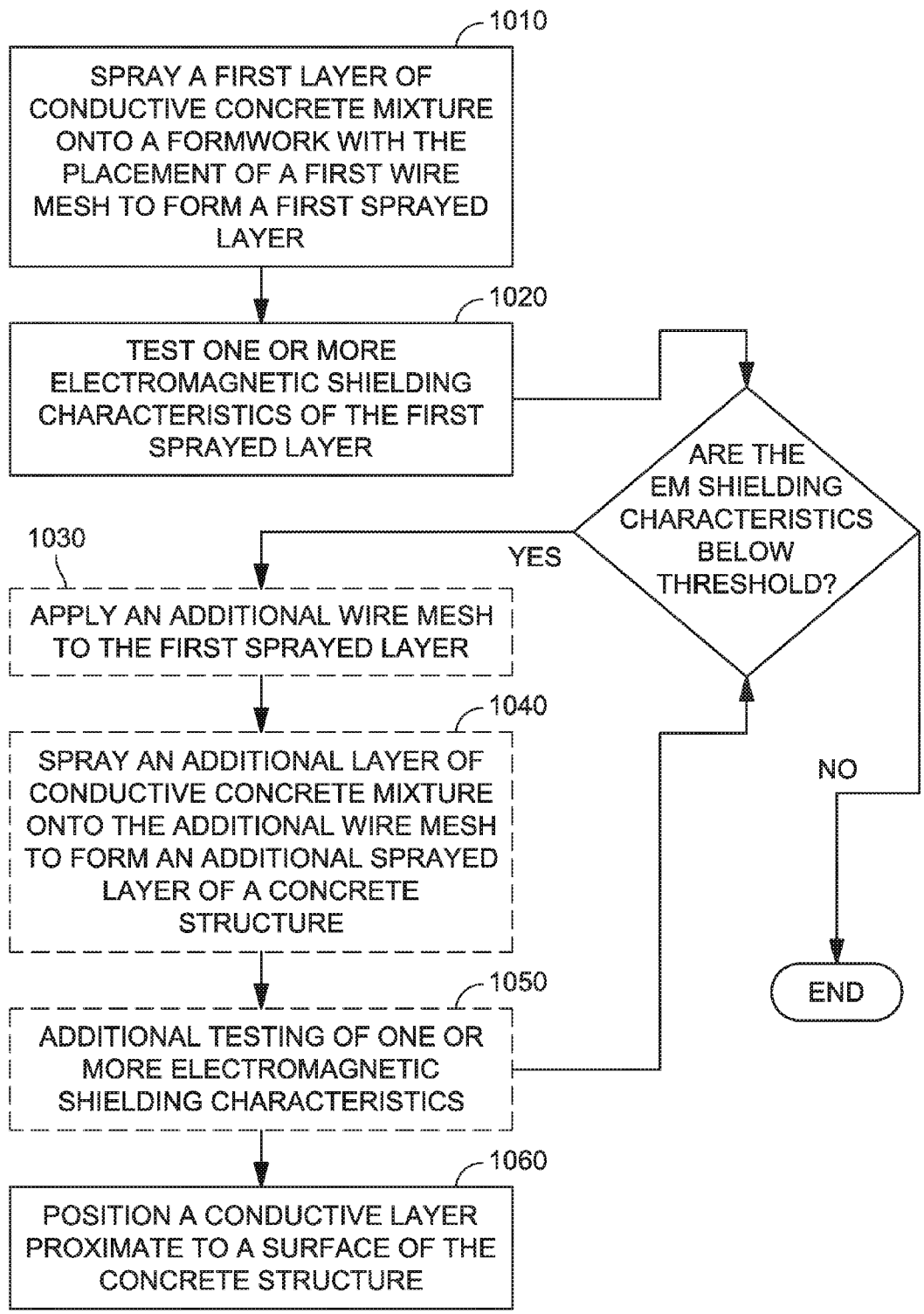

FIG. 11 is a flow diagram illustrating a method for developing a conductive concrete structure using shotcrete techniques in accordance with example implementations of the present disclosure.

DETAILED DESCRIPTION

Overview

EMP protection is desirable for facilities and infrastructure employed for critical services, such as the power grid, Command and Control ($C^2$), Command and Control Information Systems ($C^2IS$), Command, Control, Communications, Computers, Intelligence, Surveillance, and Reconnaissance ($C^4ISR$), financial institutions, research facilities, medical facilities (e.g., MRI facilities), anechoic chambers, and so forth. For example, the military is concerned with ensuring that military commanders have the ability to direct forces, while financial and other business institutions are concerned with protecting computer networks and databases crucial to electronic business (e-business). Thus, critical facilities and infrastructure are typically protected from EM threats by shielding and grounding building structures using a shielded enclosure or Faraday cage around a facility. For example, a Faraday cage can be formed as an enclosure using metallic conducting material (e.g., solid steel panels) or a mesh of conducting material (e.g., copper wire screen)

surrounding a facility. However, such shielding must be constructed in addition to the facility itself, adding to the cost and complexity of providing EM protection.

Shotcrete is a term that can describe concrete forced or impelled through a hose/nozzle using a pressurized pneumatic (e.g., air) system. Shotcrete applications can employ reinforcement materials, such as metal rods, meshes, or fibers, on which concrete is sprayed to form structures. Concrete applied by shotcrete equipment can exit the hose/nozzle with sufficient velocity to place and compact the concrete at the applied surface with the result of no cold joints. As such, shotcrete can be used to spray onto a variety of shapes and surfaces, including vertical and overhead areas.

Accordingly, the present disclosure is directed to conductive concrete building materials that provide built-in shielding against EM threats, as well as EM field immunity and radiated emission security, with particular implementations that can be applied via shotcrete applications. The present disclosure is also directed to methods of forming EM shielding structures with conductive concrete building materials via shotcrete application. For example, while concrete with embedded steel rebar can provide some electromagnetic shielding, a conductive concrete enclosure configured in accordance with the present disclosure can provide effective global shielding at frequencies of interest. Further, conductive concrete walls can also provide grounding for lightning, and dissipate the EMP induced current, which would otherwise be conducted in wires and other conductors within a structure. Additionally, use of the conductive concrete material may provide a more cost-effective building option (e.g., instead of constructing separate shielding in the manner of a Faraday cage). Further, the conductive concrete building material for application via shotcrete is in compliance with the American Concrete Institute ACI Shotcrete 506.2 standard in accordance with example implementations of the present disclosure.

In implementations, the conductive concrete mixture may include one or more magnetic materials, such as ferromagnetic material, paramagnetic material, and so forth, which serve to provide EM shielding and absorb, for instance, EM waves propagating through the conductive concrete mixture. For example, in a specific instance, the conductive concrete mixture includes a taconite rock material that comprises magnetite, such as a taconite aggregate. In shotcrete formulations, the taconite aggregate can be a fine aggregate, such as taconite sand or powder. In an example implementation, the conductive concrete mixture may employ a fine taconite aggregate having a particle size that does not exceed about three-eighths inches (⅜ inches). In some implementations, the fine taconite aggregate may comprise a particle size of about one hundred and eighty-sevenths of an inch (0.187 inches). Thus, in other implementations, the conductive concrete mixture may include other materials, such as, but not necessarily limited to: natural geological materials, mineral materials, and so forth. For example, the conductive concrete mixture may include meteoric iron (e.g., iron from nickel-iron meteorites) having kamacite and/or taenite minerals. The conductive concrete mixture may also include magnetite crystals produced by bacteria and/or magnetite collected from river or beach sands. Further, the conductive concrete mixture may include titanohematite and/or pyrrhotite (which may be ground into a powder). In still further instances, the conductive concrete mixture may include a paramagnetic mineral, such as ilmenite, titanomagnetite, and so forth. In some implementations, the conductive concrete mixture comprises cement, silica fume, slag, fly ash, taconite fine aggregate, coke breeze, water, steel fibers, steel shavings, and/or steel powder/wool.

The conductive concrete mixture also includes one or more conductive materials configured to furnish electrical conductivity to the concrete. The conductive material serves to provide EM shielding and reflect and absorb, for instance, EM waves propagating through the conductive concrete mixture. For example, the conductive concrete mixture may include at least substantially uniformly distributed conductive materials, which may include metallic and possibly non-metallic conductive materials, such as metal and/or carbon particles. In implementations, the metallic conductive material may serve to reflect and scatter EM waves, while the non-metallic conductive material may serve to absorb EM waves. For the purposes of the present disclosure, a conductive concrete mixture may be defined as a cement-based admixture containing electrically conductive components that furnish a relatively high electrical conductivity to the concrete (e.g., with respect to the electrical conductivity of typical concrete). The conductive concrete mixture may also include conductive carbon particles, such as carbon powder, and so forth, which may furnish better electrically conductive paths between portions of the conductive material, achieving, for instance, a more effective reflective-wire-mesh structure in the concrete.

In implementations, the conductive concrete mixture may include a metallic conductive material. For example, the metallic conductive material may be a steel material, such as one inch (1 in.) long steel fibers fine steel fibers, steel wool fibers, steel powder, and so forth. For shotcrete applications, the steel fibers can have an upper length limit of about one inch (1 in.) long steel fibers to facilitate flow through the hose/nozzle of the shotcrete application equipment. However, the upper length limit can vary depending on the dimensions associated with the shotcrete application equipment, such that the upper length limit can exceed one inch (1 in.) long steel fibers for larger shotcrete application equipment dimensions. In a particular instance, low-carbon steel fibers having aspect ratios from about eighteen to fifty-three (18-53) can be used to form the conductive concrete mixture. These fibers may be rectangular in shape and may have a deformed or corrugated surface to aid in bonding with the concrete material. However, steel fibers are provided by way of example only and are not meant to be restrictive of the present disclosure. Thus, other metallic conductive materials may also be utilized, including metal particles such as steel shavings, which may have varying diameters. Further, the conductive concrete mixture may include conductive aggregates, such as iron ore and/or slag. In some instances, copper-rich aggregates can be used. It should be noted that using conductive aggregates may reduce the amount of conductive fibers necessary to maintain stable electrical conductivity. Additionally, a chemical admixture may be added to the aggregate to enhance electrical conductivity and reduce the amount of conductive fibers. Further, combinations of the above-provided conductive materials may be utilized in the conductive concrete mixture, where usage of such components can depend on various considerations, including but not limited to, availability, cost, and so forth.

Example Implementations

It should be noted that the specific amounts described herein are provided by way of example only and are not meant to be restrictive of the present disclosure. Thus, other amounts of material may be used for a specified SE in accordance with the present disclosure. For example, cement may comprise from about fourteen to about eighteen percent (14-18%) of the conductive concrete mixture by weight; silica fume may comprise from about two-tenths to about one and two-tenths percent (0.2-1.2%) of the conductive concrete mixture by weight; slag may comprise from about three and one-half to about six percent (3.5-6%) of the conductive concrete mixture by weight; fly ash may comprise from about zero to about one and one-half percent (0-1.5%) of the conductive concrete mixture by weight; taconite aggregate (e.g., fine taconite aggregate) may comprise from about thirty-five to about fifty-five percent (35-55%) of the conductive concrete mixture by weight; coke breeze (e.g., a source of conductive carbon particles with fixed carbon equal to or greater than 80%) may comprise from about five to about thirty percent (5-30%) of the conductive concrete mixture by weight; water may comprise from about thirteen to about sixteen percent (13-16%) of the conductive concrete mixture by weight; steel fibers (e.g., 1-inch steel fibers) may comprise from about one-tenth to about two percent (0.1-2.0%) of the conductive concrete mixture by weight; and another steel material (e.g., one or more of steel powder, steel wool fibers, and steel shavings) may comprise from about two to about three percent (2-3%) of the conductive concrete mixture by weight. In one or more implementations, the conductive concrete mixture may employ a fine taconite aggregate having a particle size that does not exceed about three-eighths inches (⅜ inches). In some implementations, the fine taconite aggregate may comprise a particle size of about one hundred and eighty-sevenths of an inch (0.187 inches).

As another example, a cubic yard of conductive concrete mixture that can be applied via shotcrete techniques in accordance with the present disclosure can include cement in an amount from about five hundred sixty to six hundred fifty pounds (560-650 lbs); silica fume in an amount from about ten to forty pounds (10-40 lbs); slag in an amount from about one hundred fifty to two hundred fifty pounds (150-250 lbs); fly ash in an amount from about zero to fifty pounds (0-50 lbs); taconite aggregate in an amount from about one-thousand five hundred to two-thousand twenty pounds (1,500-2,020 lbs); coke breeze in an amount from about four-hundred fifty to six-hundred fifty pounds (450-650 lbs); water in an amount from about five-hundred twenty to six-hundred fifty pounds (520-650 lbs) of the conductive concrete mixture by weight; steel fibers (e.g., 1-inch steel fibers) in an amount from about thirty to forty pounds (30-40 lbs); and another steel material (e.g., one or more of steel powder, steel wool fibers, and steel shavings) in an amount from about seventy-five to one-hundred twenty pounds (75-120 lbs). The coke breeze, which can provide a source of conductive carbon particles, can include the carbon particles in an amount from about seventy to ninety percent (70-90%) by weight. The balance of the coke breeze can include, for example, one or more of water, quartz, sulfur, sodium monoxide, calcium oxide, magnesium oxide, potassium oxide, titanium dioxide, alumina, iron oxide, phosphorous pentoxide, and manganese oxide.

Shotcrete Formulation Example Testing

The relative attenuation of six test panels formed via shotcrete application into six-inch (6 in) thick panels of six different concrete mixtures was analyzed. The six concrete mixtures were provided as follows:

TABLE 1

| (lbs) | Cement | Silica Fume | Slag | Fly Ash | Fine Taconite | Coke Breeze | Water | Steel Fiber | Steel Shaving | Steel Wool |
|---|---|---|---|---|---|---|---|---|---|---|
| Mix 1 | 43.25 | 0 | 29.5 | 6.5 | 262.5 | 82 | 50 | 5 (1 in) | 0 | 15 |
| Mix 2 | 43.25 | 0 | 29.5 | 6.5 | 240 | 125 | 50 | 0 | 0 | 0 |
| Mix 3 | 86.5 | 0 | 30 | 7 | 263 | 82 | 105 | 0 | 5 | 15 |
| Mix 4 | 86.5 | 3 | 30 | 7 | 263 | 82 | 85 | 0 | 0 | 15 |
| Mix 5 | 86.5 | 3 | 30 | 7 | 263 | 82 | 85 | 5 (1.5 in) | 0 | 15 |
| Mix 6 | 86.5 | 3 | 30 | 7 | 263 | 82 | 82 | 0 | 30.5 | 0 |

Table 2 illustrates another implementation of conductive concrete building materials that can be applied via shotcrete techniques. Table 2 illustrates, in a cubic yard, percentage by weight of a mixture of conductive concrete in accordance with an example implementation of the present disclosure:

TABLE 2

| Material | Percentage |
|---|---|
| Cement | 14-18% |
| Silica Fume | 0.2-1.2% |
| Slag | 3.5-6% |
| Fly Ash | 0-1.5% |
| Taconite fine (fine taconite aggregate material) | 35-55% |
| Coke Breeze | 5-30% |
| Water | 13-16% |
| Steel fibers 1-in. | 0.1-2% |
| Steel wool/powder/shavings | 2-3% |

It should be noted that the specific amounts described above are provided by way of example only and are not meant to be restrictive of the present disclosure. Thus, other amounts of material may be used in accordance with the present disclosure.

As described above, shotcrete applications can employ reinforcement materials, such as metal rods, meshes, or fibers, on which concrete is sprayed to form structures. Thus, the present disclosure describes a mixture allowing for shotcrete application. For instance, the mixture may comprise 1-inch steel fibers and fine taconite aggregate to assist in preventing clogging of the nozzle that disperses the mixture via shotcrete application (e.g., steel fibers larger than 1-inch and coarse taconite aggregate may clog the nozzle). It is understood that various nozzles may be utilized. For instance, a first nozzle having a first nozzle opening characteristic may be utilized during a first application. In another instance, a second nozzle having a second nozzle characteristic may be utilized during a second application. Thus, depending upon the opening characteristic of the nozzle, various types of conductive concrete mixture may be utilized.

Figure 1:
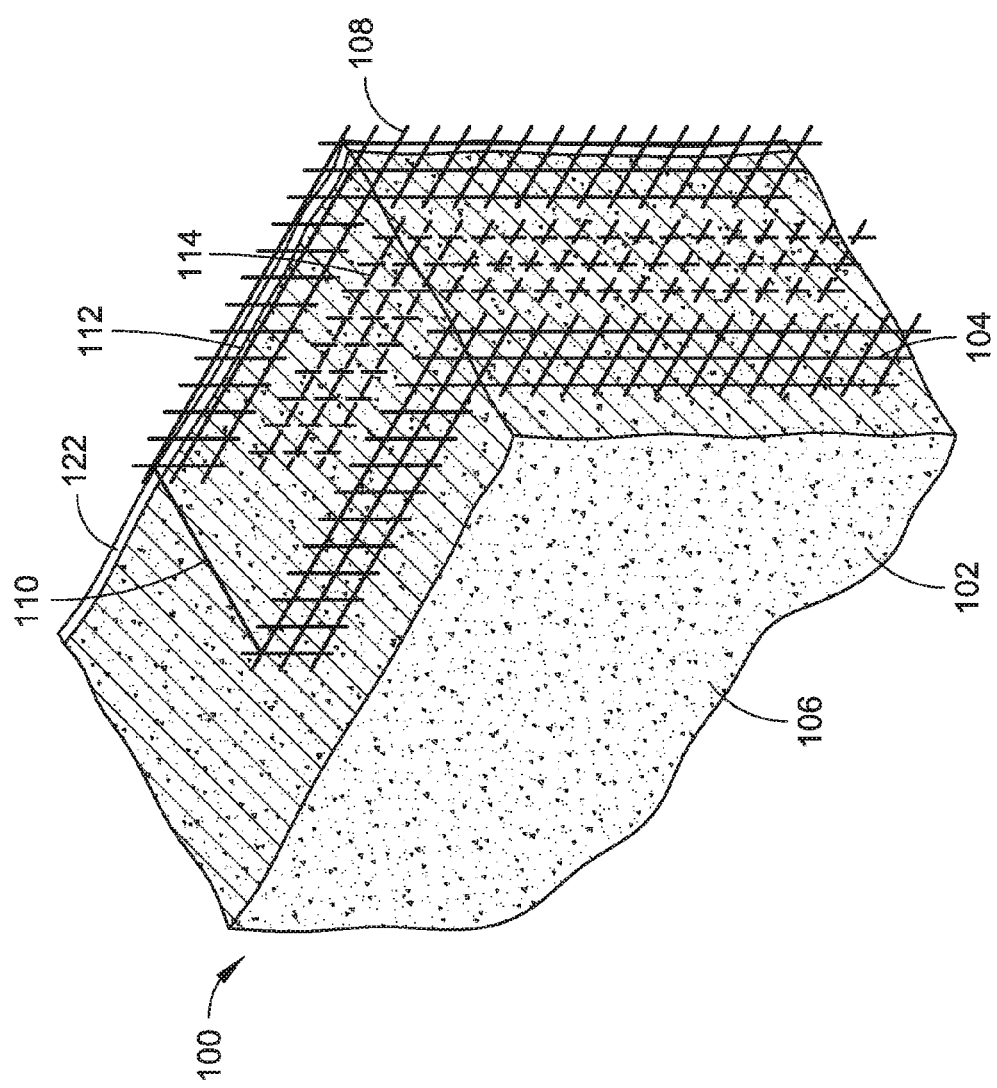
FIG. 1 is a partial cross-sectional isometric view illustrating a concrete structure formed using conductive concrete mixture, conductive layers, and conductive screens in accordance with example embodiments of the present disclosure.
Figure 2:
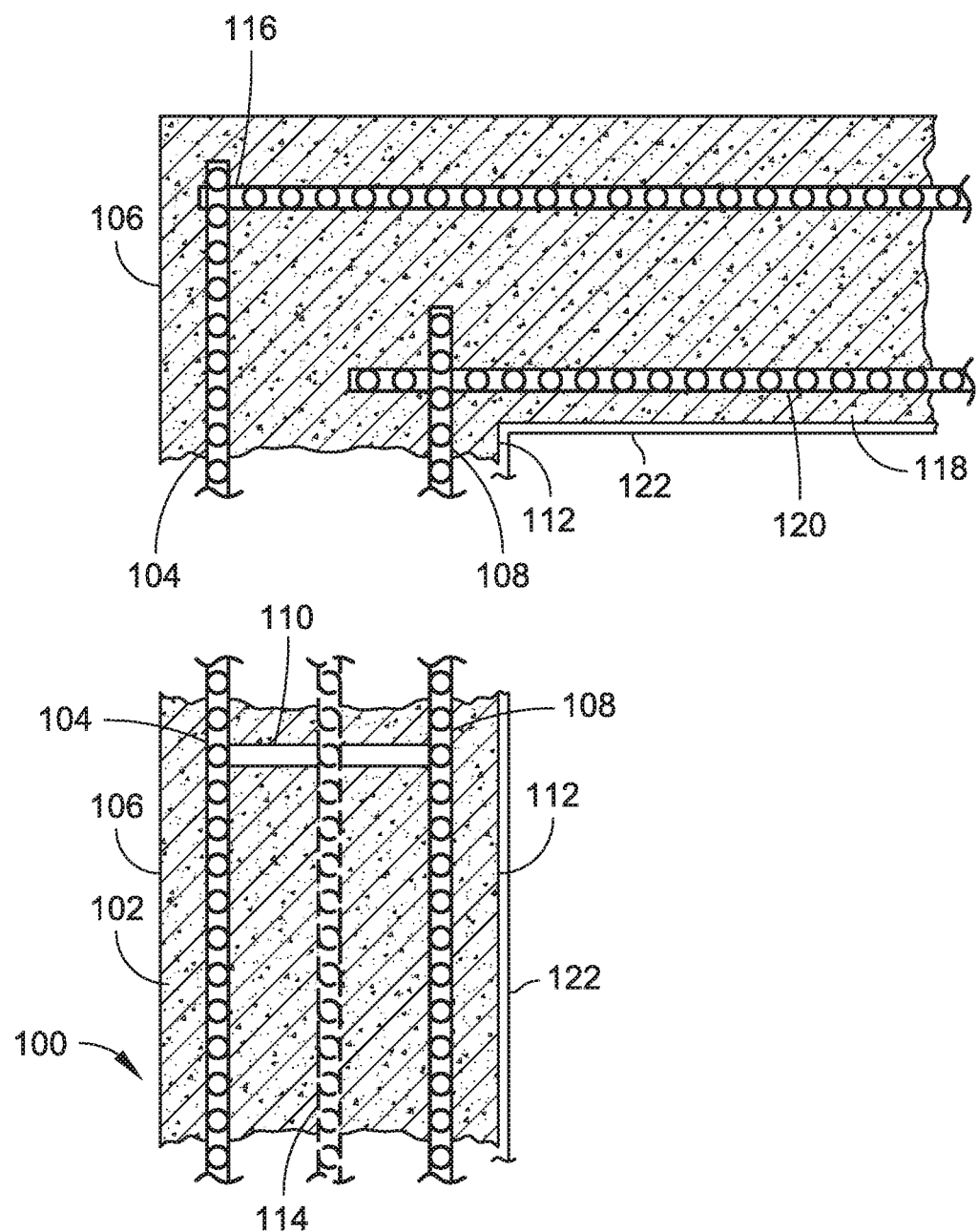
FIG. 2 is a partial end elevation view illustrating a concrete structure formed using conductive concrete mixture, a conductive layer, and conductive screens in accordance with example embodiments of the present disclosure.

Referring now to FIGS. 1 through 2, an example concrete structure 100 is described in accordance with example embodiments of the present disclosure. The concrete structure 100 includes conductive concrete 102 formed from a concrete mixture as described herein (e.g., shotcrete application of the concrete mixture). The concrete structure 100 may include a first conductive screen 104 disposed within the conductive concrete 102 and positioned close (e.g., proximate) to an exterior surface 106 of the conductive concrete 102.

The concrete structure 100 also includes a second conductive screen 108 disposed within the conductive concrete 102 and in electrical contact with the first conductive screen 104 to provide a metal shield embedded in the conductive concrete via a conductive tie 110 (e.g., welded together, steel twister-tie, etc.), which complements the shielding against low-frequency (e.g., one hundred megahertz (100 MHz) or less) EMP. The second conductive screen 108 can be positioned close (e.g., proximate) to an exterior surface 112 of the conductive concrete 102 (e.g., another exterior surface generally opposite the exterior surface 106).

In some embodiments, the concrete structure 100 can include a third conductive screen 114 disposed within the conductive concrete 102 between the first conductive screen 104 and the second conductive screen 108, e.g., where the third conductive screen 114 is in electrical contact with the first conductive screen 104 and the second conductive screen 108. For example, the third conductive screen 114 can be connected to the first conductive screen 104 and/or the second conductive screen 108 via a conductive tie 110 (e.g., welded, steel twister-tie, etc.). In an example embodiment where the conductive concrete 102 forms a wall twelve inches (12 in.) thick, a first conductive screen 104 is positioned about two inches (2 in.) from an exterior surface 106 of the conductive concrete 102, a second conductive screen 108 is positioned about two inches (2 in.) from an exterior surface 112 of the conductive concrete 102, and a third conductive screen 114 is positioned in the middle of the wall, about four inches (4 in.) from each of the first conductive screen 104 and the second conductive screen 108. It should be noted that more than three conductive screens can be disposed within the conductive concrete 102 (e.g., four (4) conductive screens, five (5) conductive screens, six (6) conductive screens, and so forth). All of these conductive screens can be in electrical contact with one another and grounded.

With reference to FIG. 2, the first conductive screen 104 and/or the second conductive screen 108 (and possibly the third conductive screen 114 and/or other conductive screens) can also be in electrical contact with one or more additional conductive screens, which can be disposed in the conductive concrete 102 or another concrete material. In embodiments of the disclosure, these various conductive screens can be disposed in concrete features that extend along different planes and/or in different directions (e.g., horizontally and vertically). For example, the first conductive screen 104 can be a vertically-extending screen connected (e.g., twister-tied, welded) to a horizontally-extending conductive screen 116 disposed in a concrete feature 118. In some embodiments, the concrete feature 118 is also formed from a conductive concrete mixture as described herein. For example, the concrete feature 118 can be formed of the conductive concrete 102. Further, the second conductive screen 108 can be a vertically-extending screen connected (e.g., twister-tied, welded) to a horizontally-extending conductive screen 120 disposed in the concrete feature 118. The third conductive screen 114 can also be connected to a conductive screen disposed in the concrete feature 118 (e.g., connected to a horizontally-extending conductive screen between the conductive screen 116 and the conductive screen 120). In this manner, various conductive screens (e.g., 104, 108, 114, 116, 120, and so forth) can be in electrical contact with one another and grounded.

The conductive screen 116 and/or the conductive screen 120 disposed within the concrete feature 118 can also be positioned close (e.g., proximate) to an exterior surface of the concrete feature 118. In embodiments of the disclosure, the conductive screen 116 and/or the conductive screen 120 can be positioned at a distance of less than approximately three inches (3 in.) or eight centimeters (8 cm) from one or more exterior surfaces of the concrete feature 118.

One or more of the conductive screens may comprise a network, lattice, framework, and so forth of conductive material that defines multiple apertures (e.g., circular openings, elliptical openings, square openings, rectangular openings, hexagonal openings, octagonal openings, and so on). For instance, one or more of the conductive screens can be welded wire fabric (WWF), welded wire rebar (WWR), a fine metal screen, thin wire with a coarse screen, and/or various combinations thereof. For example, a conductive screen can comprise a woven wire mesh defining apertures each having a characteristic opening size of less than approximately three-quarters of an inch (0.75 in.). However, this mesh is provided by way of example only and is not meant to limit the present disclosure. In other embodiments, a conductive screen can comprise a mesh having a first group of elongated wires arranged proximate to one another across a second group of elongated wires, where the first elongated wires and the second elongated wires are directly fastened together (e.g., tied, welded) to define apertures each having a characteristic opening size of less than approximately three inches (3 in.). For example, light gauge wires, medium gauge wires, heavy gauge wires, rebar, and so forth can be welded together to form a mesh, where the openings between adjacent wires are approximately one inch (1 in.) by one inch (1 in.), two inches (2 in.) by two inches (2 in.), three inches (3 in.) by three inches (3 in.), and so forth. Wires can include, but are not necessarily limited to: light gauge wires, medium gauge wires, heavy gauge wires, rebar, and so forth. For example, the conductive screen can be formed using one hundred and ninety-two one-thousandths of an inch (0.192 in.) diameter wire, one-eighth of an inch (⅛ in.) diameter wire, one-quarter inch (¼ in.) diameter rebar (e.g., #2 steel rebar), three-quarters of an inch (¾ in.) diameter rebar (e.g., #6 steel rebar), and so forth.

Each conductive screen can comprise one or more layers of various materials. For example, the first conductive screen 104 and/or the second conductive screen 108 can each comprise two or more layers of woven wire mesh defining apertures each having a characteristic opening size of less than approximately one quarter of an inch (0.25 in.). Further, different materials can be used for conductive screens proximate to exterior surfaces of the conductive concrete 102, conductive screens disposed between them, and so on. For example, a first conductive screen 104 positioned two inches (2 in.) from an exterior surface 106 of the conductive concrete 102 comprises WWF, a second conductive screen 108 positioned two inches (2 in.) from an exterior surface 112 of the conductive concrete 102 comprises WWF, and a third conductive screen 114 positioned between them comprises WWR. In these embodiments, the WWFs, the WWR, fibers in the conductive concrete 102, and so forth, can all be electrically interconnected. As described above, the conductive screens (e.g., screens 104, 108) are positioned at various depths within the concrete structure 100 as with respect to other conductive screens. For instance, the first screen 104 is positioned at a first depth within the structure 100 with respect to the second screen 108 (e.g., the second screen 108 is positioned at a second depth) such the screens 104, 108 are grounded but otherwise physically isolated (e.g., distinct) with respect to one another.

As shown in FIGS. 1 and 2, a conductive layer 122 may be positioned proximate to a surface (e.g., surface 106, 112) of the concrete surface. In some implementations, the conductive layer 122 is positioned (e.g., applied, disposed, etc.) over the surface 106, 112 using a suitable adhesive. In one or more implementations, the conductive layer 122 provides a synergistic interaction between the conductive concrete and other metallic components (e.g., conductive screens 104, 108, etc.) to provide improved electromagnetic shielding across various frequency ranges as described below. Conductive layers 122 (e.g., metal panels or very fine wire screens) increases the reflection of electromagnetic waves that are then absorbed by the conductive concrete layer, further attenuating the electromagnetic waves and thereby enhancing the shielding effectiveness. In one or more implementations, the conductive layer 122 may comprise copper, aluminum, galvanized steel, stainless steel, wire mesh, combinations thereof, or the like. In some implementations, multiple layers of conductive concrete may be applied to the conductive layers 122 to increase the electromagnetic shielding. Thus, the conductive concrete structure 100 may employ a configuration where the conductive layer 122 is disposed between the conductive concrete layers.

Figure 3:
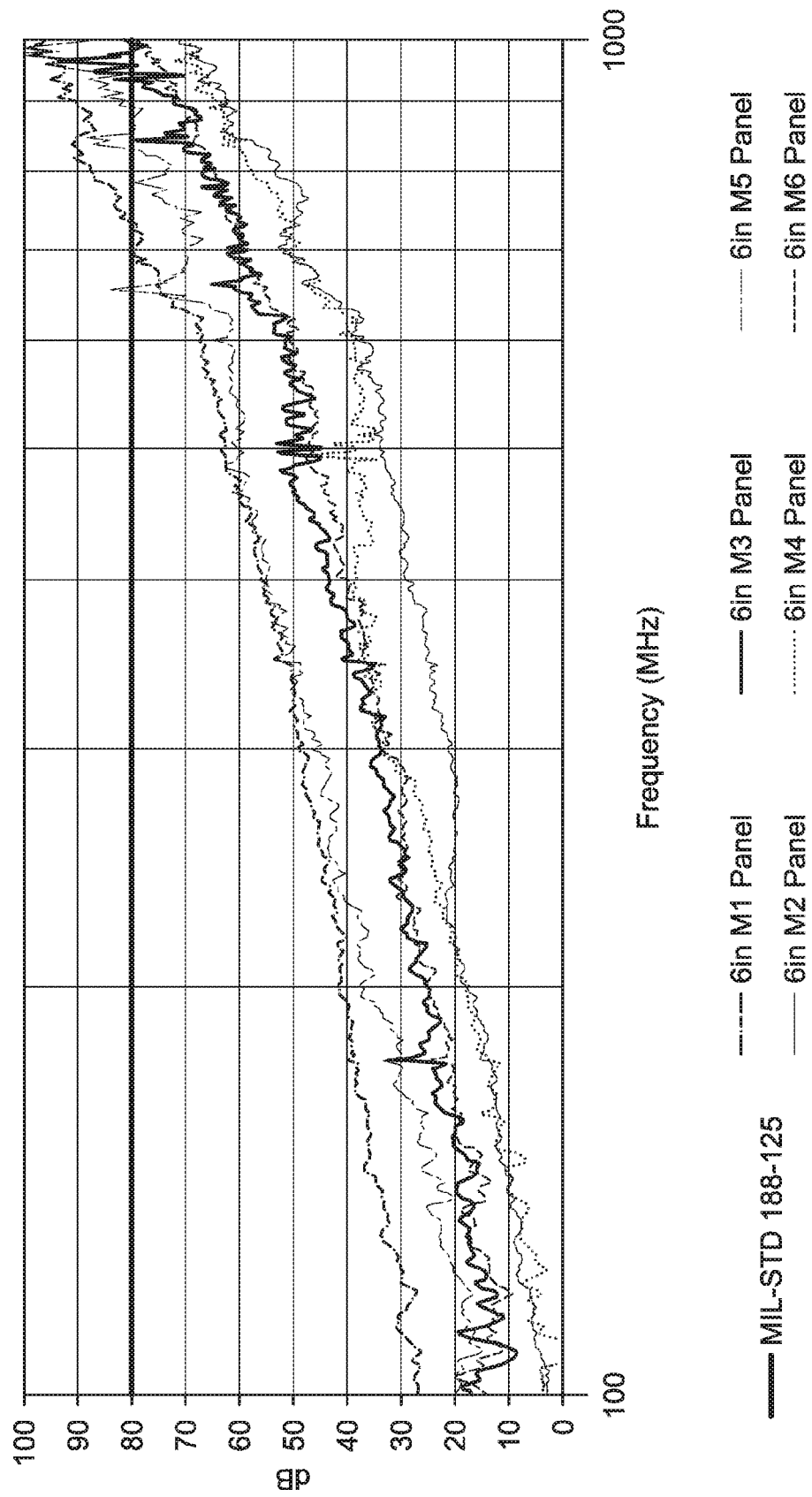
FIG. 3 is a graph illustrating the relative attenuation of six six-inch (6 in.) panels formed via shotcrete application techniques.
Figure 4:
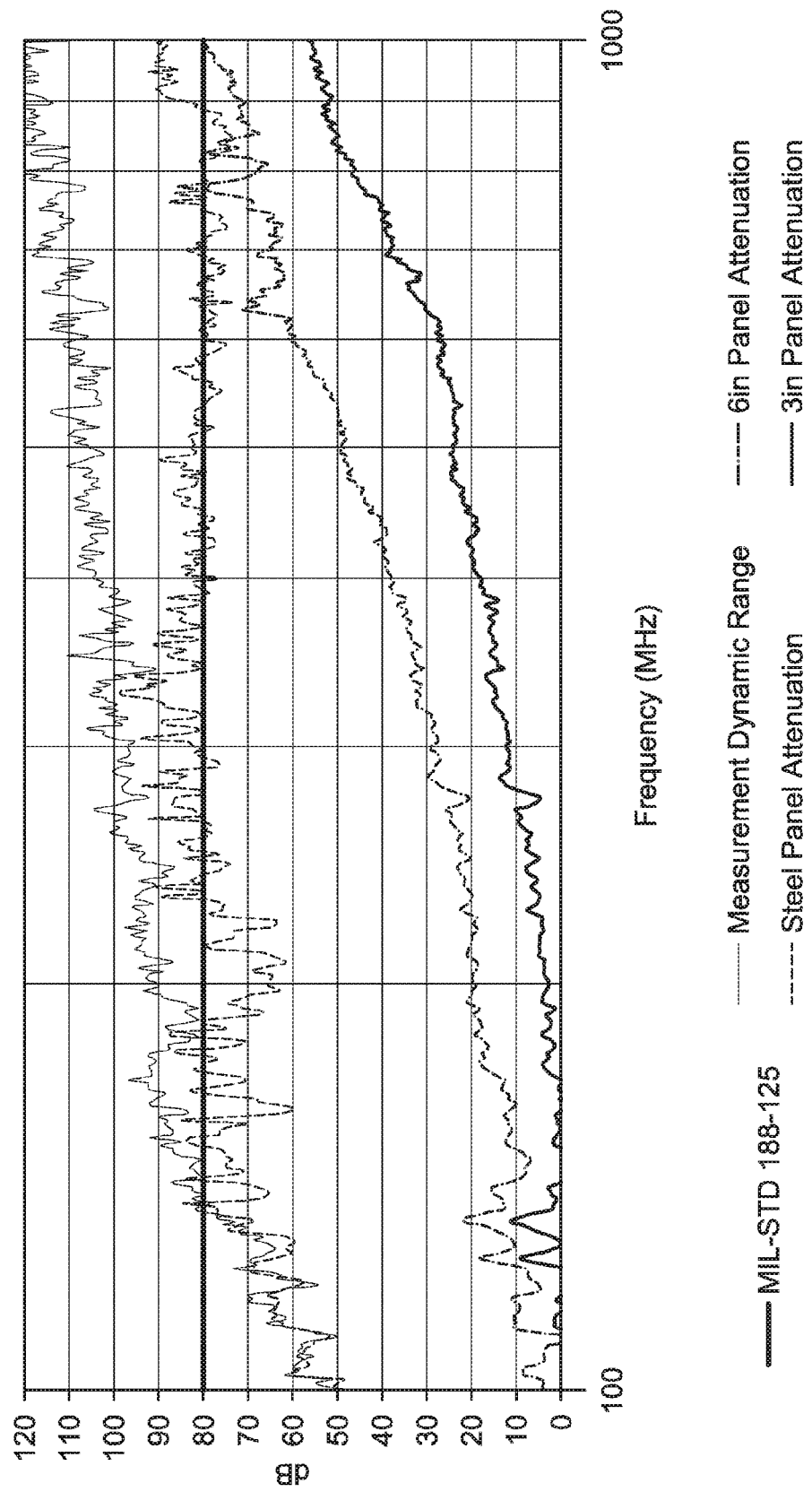
FIG. 4 is a graph illustrating the relative attenuation of a three-inch (3 in.) panel and a six-inch (6 in.) panel formed via shotcrete application techniques.

FIG. 3 plots the relative attenuation of the 6-in shotcrete mix panels. The results show that steel fiber and steel wool can have substantive effects on relative attenuation, with mix M1 having an overall best attenuation performance over the tested frequency range (100 MHz to 1,000 MHz). The M1 mix was formed via shotcrete application into a three-inch (3 in) panel and a six-inch (6 in) panel for relative attenuation testing. FIG. 4 plots the relative attenuation of the 3-in and 6-in shotcrete M1 mix panels.

Figure 5:
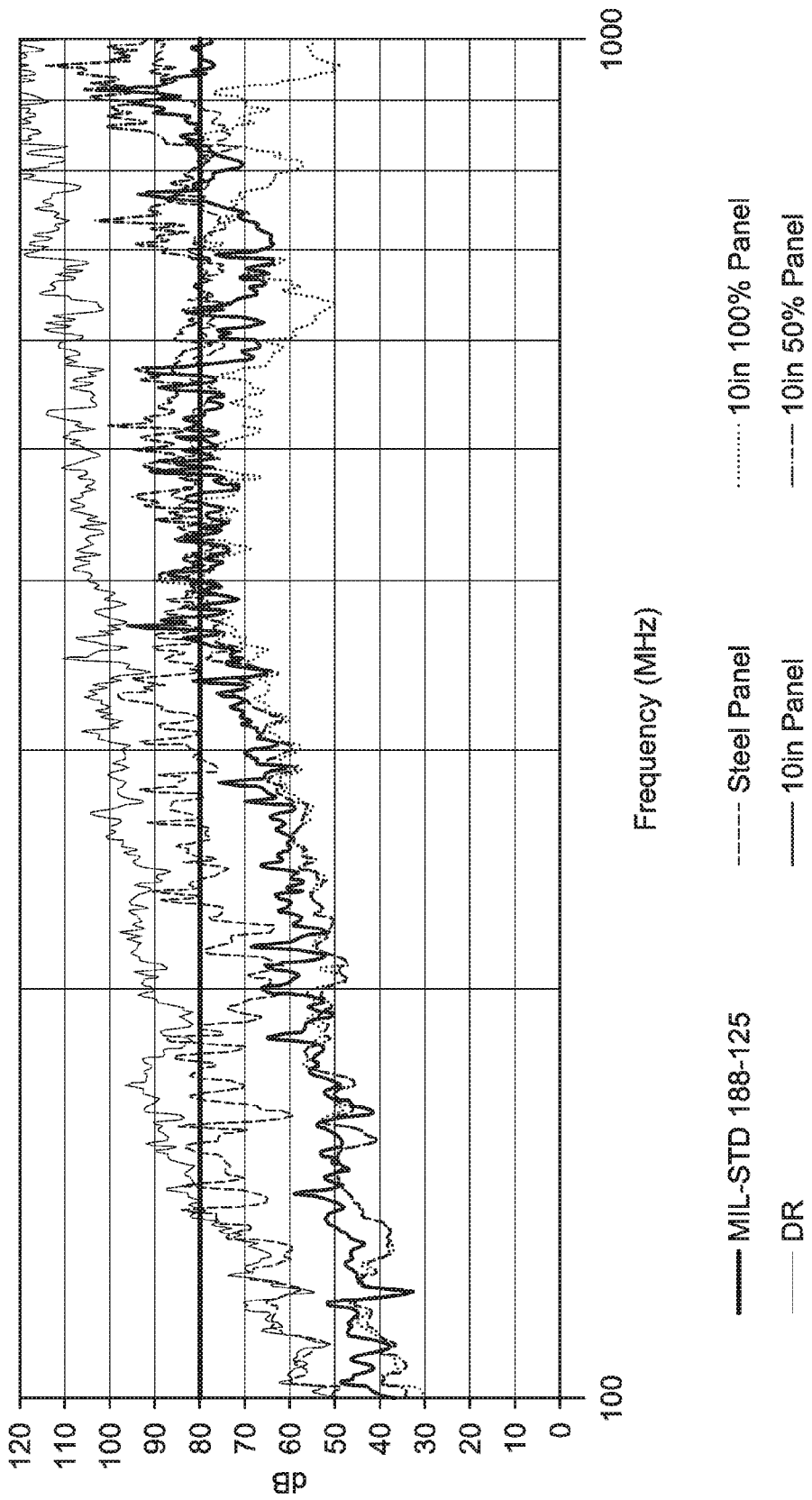
FIG. 5 is a graph illustrating the relative attenuation of ten-inch (10 in.) panels with two wire mesh layers formed via shotcrete application techniques.

The effect of embedding wire mesh in the shotcrete was evaluated with 10-in shotcrete panels having two layers of wire mesh welded to a steel base plate. Panels were cast using mix M1, with 100% and 50% cement by weight. FIG. 5 shows the test results, with the 10-in panel demonstrating improved attenuation across the tested frequency range (100 MHz to 1,000 MHz).

Figure 6:
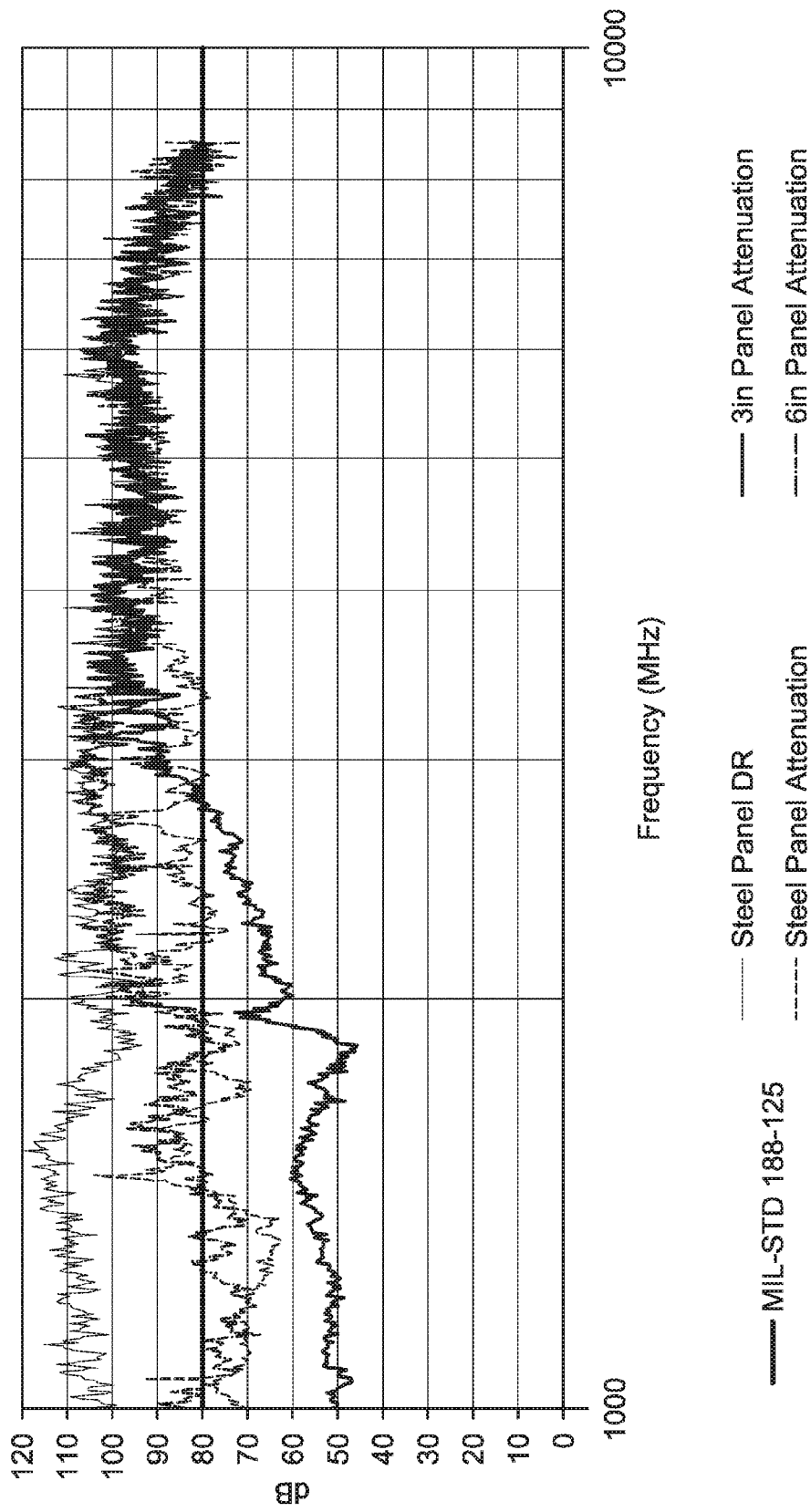
FIG. 6 is a graph illustrating the relative attenuation, at a higher frequency than that of FIG. 4, of the three-inch (3 in.) panel and the six-inch (6 in.) panel formed via shotcrete application techniques.
Figure 7:
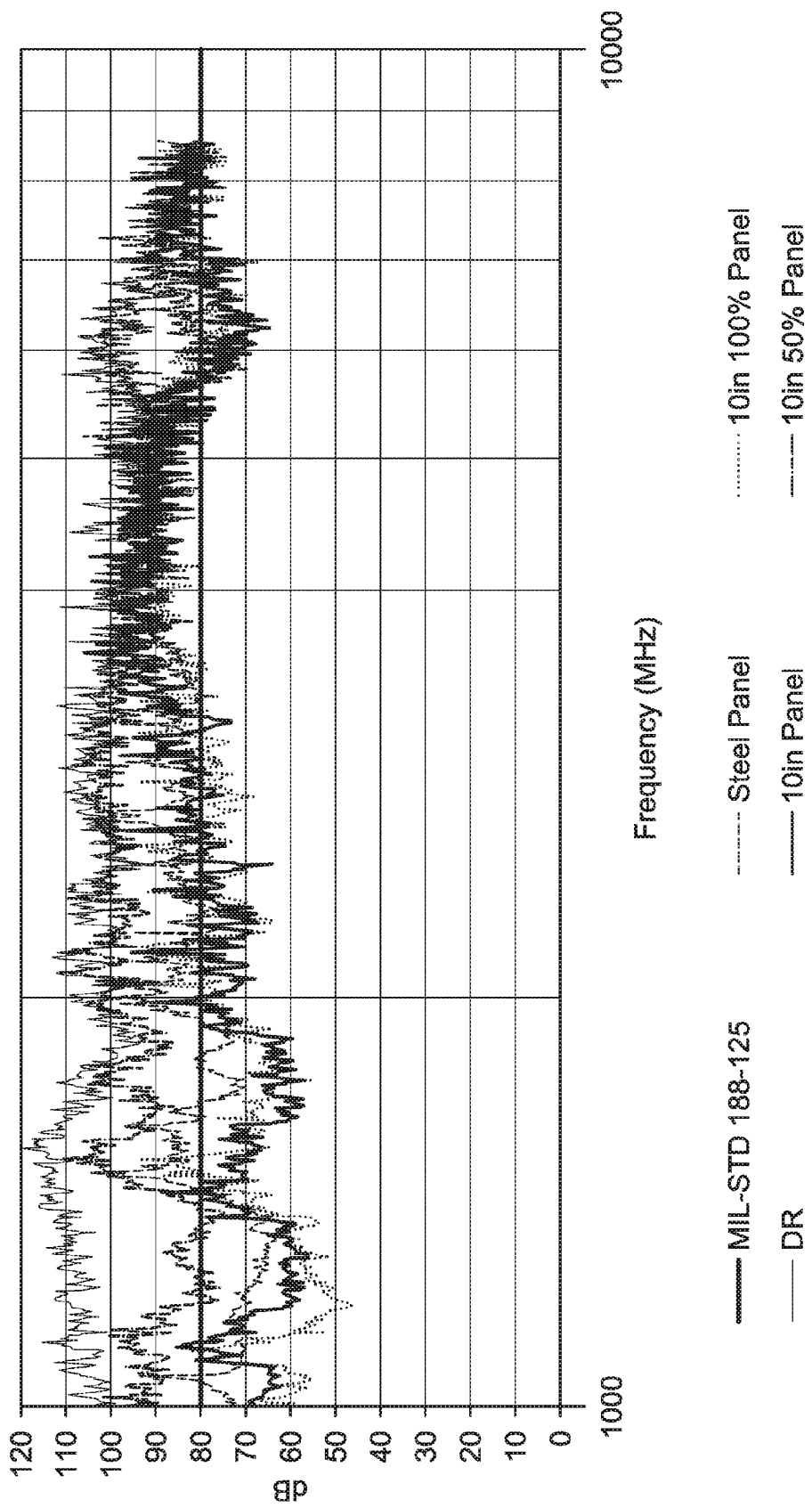
FIG. 7 is a graph illustrating the relative attenuation, at a higher frequency than that of FIG. 5, of the ten-inch (10 in.) panels with two wire mesh layers formed via shotcrete application techniques.

The panels were further evaluated for broadband microwave attenuation from 1,000 MHz to 8,500 MHz) using a microwave power amplifier (Gigatronics GT-1000B). As shown by the plots of the measurement results in FIG. 6 (showing relative attenuation of the three-inch M1 mix panel and the six-inch M1 mix panel) and FIG. 7 (showing relative attenuation of the ten-inch M1 mix panels with wire layers), the shotcrete panels demonstrated excellent attenuation up to the frequency limit of the test equipment at 8,500 MHz.

Figure 8:
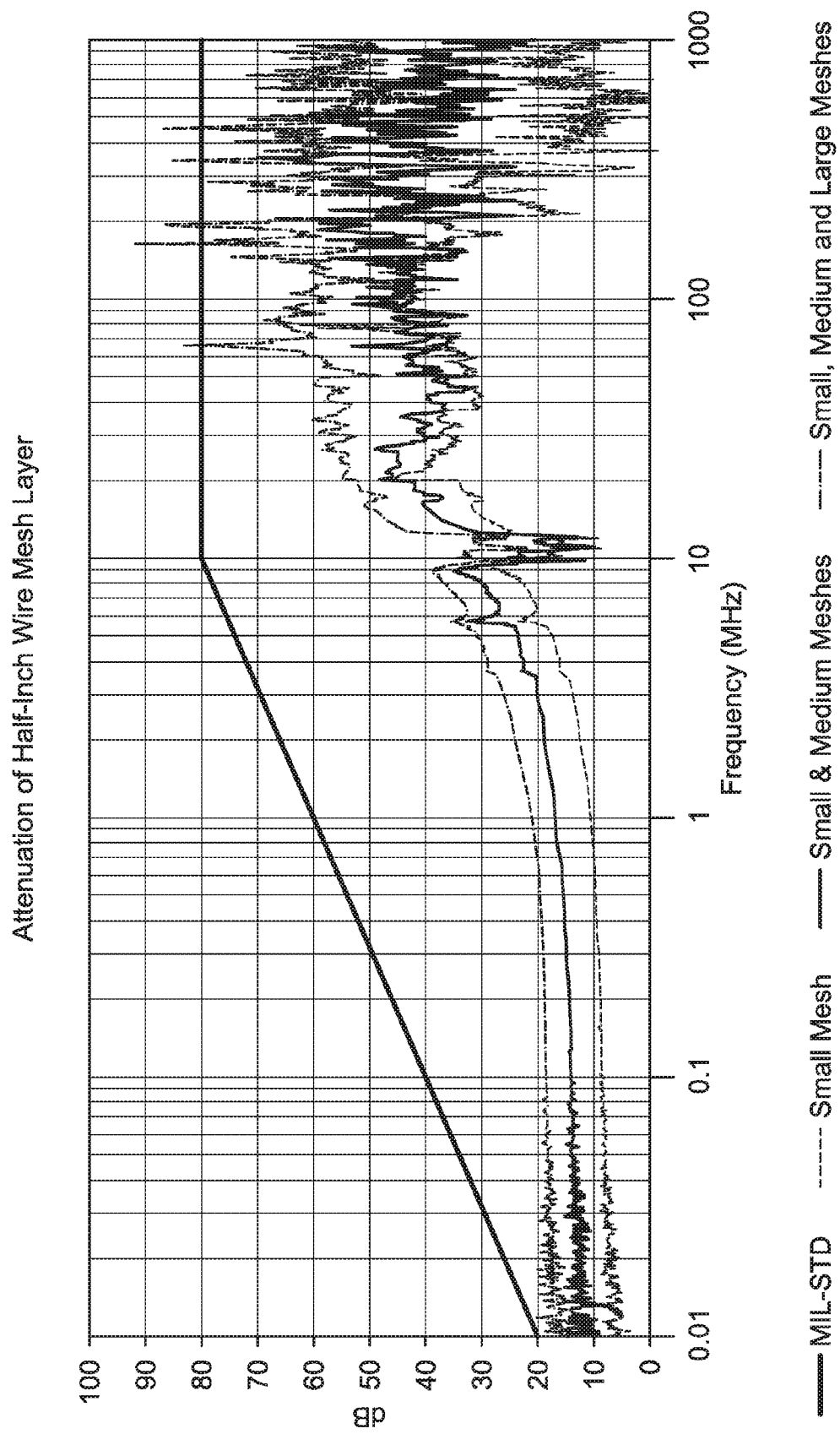
FIG. 8 is a graph illustrating relative attenuation of an EM signal with respect to various one-half inch (½ in.) wire mesh structures.

FIG. 8 illustrates an attenuation plot of an EM signal over a frequency range with respect to various stand-alone one-half inch (½ in.) wire meshes. FIG. 9 illustrates an attenuation plot of an EM signal over a frequency range with respect to a portion of a concrete structure constructed from the conductive concrete mixture as discussed herein. For instance, FIG. 9 illustrates plots representing free-space dynamic range (DR), measurement dynamic range (DR), the military standard (MIL-STD), and attenuation of the EM signal due, at least in part, to the conductive concrete mixture discussed within the present application.

FIG. 9 also illustrates the measurement results of the room with additional two inches (2 in) of the conductive concrete mixture applied to the metallic panel interior (e.g., conductive layer 122). The measurement results indicate that the additional conductive shotcrete layer averages about 10 dB to 20 dB of improvement in attenuation above 100 MHz. The metallic panel interior may also provide a synergistic effect by providing for blast resistance enhancement. Although the measurement dynamic range would limit the extent that the improvement could be determined, this result is generally consistent with the expected 10 dB of absorption per inch of conductive shotcrete. The attenuation data in the above figures indicates that the combination of additional conductive concrete sprayed layers and/or a conductive layer 122 (e.g., metallic framework) in contact with the surface 106, 112 would contribute to enhance the electromagnetic shielding performance across the desired frequency range. The conductive layer 122 (which may include anchor bolts) embedded in the conductive concrete structure may serve to mitigate (e.g., function as a "safety net" to prevent/capture) high-velocity concrete fragments induced by an external explosion/blast.

It is contemplated that increasing the number of conductive concrete layers of the conductive concrete structure 100 may provide a synergistic effect pertaining to increasing the blast resistance of the structure 100 by increasing the stability of the structure 100. More specifically, increasing the number of concrete layers applied via shotcrete application can serve to mitigate blast risks associated with the structure 100 relating to air-blast effects. Additionally, an increase in conductive concrete layers may increase a blast resistance of the structure 100 by reducing buckling effects and/or lateral torsional instabilities.

Example Processes

Referring now to FIG. 10, example techniques for making a conductive concrete mixture are described. FIG. 10 depicts a process 900, in an example implementation, for making a conductive concrete mixture using, for instance, metallic conductive material, conductive carbon particles, and magnetic material, such as taconite aggregate, as described above.

In the process 900 illustrated, conductive carbon particles, graphite powder, aggregate, such as sand and gravel, and fine steel fibers are blended to form a dry mix (Block 910). For shotcrete applications, the blend may include conductive carbon particles provided by coke breeze. In implementations, the materials may be blended in a container such as the drum of a concrete truck mixer, and so forth. However, a concrete truck mixer is provided by way of example only, and other containers for mixing concrete may also be used, and can include shotcrete application equipment. In a specific instance, the materials of the dry mix are mixed for at least five (5) minutes. Next, cement (e.g., Type I cement), water, and a magnetic material, such as crushed taconite aggregate (e.g., fine taconite aggregate material), are added to the dry mix to form a wet mix (Block 920). For shotcrete applications, the magnetic material can include a taconite fine aggregate, such as taconite sand. Silica fume, other SCM, and/or an admixture, such as superplasticizer (water reducer/High Range Water Reducer (HRWR)) can also be added to the wet mix. In implementations, the wet mix is formed at the concrete truck.

Then, metallic conductive material, such as steel fiber, is added to the wet mix (Block 930). For example, steel fibers can be added in the truck mixer using, for instance, a conveyor (e.g., conveyor belt) extending into the truck mixer. In implementations, the steel fibers are spread out to at least substantially uniformly distribute the steel fibers on the conveyor (e.g., to avoid flocculation or balling of the steel fibers). For example, the steel fibers can be placed on a conveyor belt by hand. Next, conductive material is mixed with the wet mix to form a conductive concrete mixture (Block 940).

It should be noted that while process 900 describes adding the metallic conductive material to the wet concrete mixture, the metallic conductive material may be added during the mixing of cement and/or aggregate in either wet or dry conditions. Further, it is desirable to maintain at least substantially uniform disbursement of the metallic conductive material during mixing. Thus, mixing may be performed according to guidelines specified by, for example, American Concrete Institute (ACI) Committee 544 for mixing steel fibers. U.S. Pat. No. 6,825,444, issued Nov. 30, 2004, entitled "Heated Bridge Deck System and Materials and Method for Constructing the Same" includes example mixing procedures that can be used with the conductive concrete mixture of the present disclosure and is incorporated herein by reference in its entirety.

Referring now to FIG. 11, example techniques for forming conductive concrete structures to provide EM shielding are described. FIG. 11 depicts a process 1000, in an example implementation, for forming a conductive concrete structure using shotcrete techniques. As described here, forming the conductive concrete structure comprises one or more layers of the conductive concrete mixture to form a concrete structure through a hose/nozzle using a pressurized pneumatic (e.g., air) system.

In the process 1000 illustrated, a first layer of conductive concrete mixture is sprayed onto formwork with the placement of a first wire mesh to form a first sprayed layer via shotcrete application (Block 1010). The conductive concrete mixture is generally suitable for application via shotcrete techniques, and can include, for example, the conductive concrete mixtures described herein for shotcrete applications. When developing the build process of a structure, next, one or more electromagnetic shielding characteristics of the first sprayed layer is tested (Block 1020). For example, the relative attenuation or other electromagnetic shielding property of the first sprayed layer can be evaluated. Then, where the tested one or more electromagnetic shielding characteristics is below a threshold value, a second sprayed layer with the placement of a second wire mesh is applied to the first sprayed layer (Block 1030). For instance, the threshold value can include an industry or government standard for electromagnetic shielding, such as the military standard (MIL-STD) 188-125-1 or the emanation security (EMSEC) requirements per TEMPEST standard. Optionally, an additional layer of conductive concrete mixture is sprayed onto the additional wire mesh to form an additional sprayed layer of a concrete structure (Block 1040). Additional testing of the concrete structure may be performed to determine whether the concrete structure provides electromagnetic shielding characteristics that meet various threshold shielding values (Block 1050). Accordingly, additional layers of wire mesh and/or sprayed conductive concrete mixture can be applied to the concrete structure to obtain a desired level of electromagnetic shielding. As shown in FIG. 11, an optional conductive layer can be positioned proximate to an exterior surface of the concrete structure (Block 1060). For example, the conductive layer 122 can be positioned (via a suitable process such as adhesion, coupling, etc.) proximate to an exterior surface (e.g., an exposed surface) of the concrete structure. The conductive layer 122, in implementations, can be directly coupled (e.g., directly adjacent) to the exterior surface (the conductive layer 122 is in contact with the surface). In other implementations, another layer may be disposed between the surface and the conductive layer 122. The process 1000 can be utilized to form concrete structures having any desired shape, form, and the like, including but not limited to rectangular buildings, domes, arched roof buildings, anechoic chambers (e.g., RF and microwave anechoic chambers), MM facilities, EM secured buildings and data centers, shielded rooms for electromagnetic compatibility (EMC), interference (EMI) and radiated emission (EME) immunity evaluation, RF ground planes, antenna test range facilities, structures for grounding an protecting electrical power distribution systems (e.g., protection from geo-magnetic disturbances (GMD)), and so forth.

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A concrete structure for providing effective electromagnetic shielding, the concrete structure comprising:
   conductive concrete having a first surface, the conductive concrete formed from a concrete mixture comprising:
      cement at a level of from approximately fourteen percent (14%) to approximately eighteen percent (18%) of the concrete mixture by weight;
      fine taconite aggregate material at a level of from approximately thirty-five percent (35%) to approximately fifty-five percent (55%) of the concrete mixture by weight;
      coke breeze at a level of from approximately five percent (5%) to approximately thirty percent (30%) of the concrete mixture by weight; and
      metallic conductive material at a level of from approximately one-tenth percent (0.1%) to approximately two percent (2%) of the concrete mixture by weight, the metallic conductive material comprising steel fibers having a maximum size of one inch (1 inch); and
   a metal layer in contact with the conductive concrete.

2. The concrete structure as recited in claim 1, wherein the metal layer is disposed directly adjacent to the first surface.

3. The concrete structure as recited in claim 1, wherein the metal layer comprises at least one of copper, aluminum, galvanized steel, stainless steel, or wire mesh.

4. The concrete structure as recited in claim 1, wherein respective particles of the fine taconite aggregate material are characterized by a maximum particle size of three-eighths inches (⅜").

5. A conductive concrete formed from a concrete mixture for providing effective electromagnetic shielding, the concrete mixture comprising:
   cement at a level of from approximately fourteen percent (14%) to approximately eighteen percent (18%) of the concrete mixture by weight, fine taconite aggregate material at a level of from approximately thirty-five percent (35%) to approximately fifty-five percent (55%) of the concrete mixture by weight, respective particles of the fine taconite aggregate material having a maximum particle size of three-eighths inches (3/8 inches), coke breeze at a level of from approximately five percent (5%) to approximately thirty percent (30%) of the concrete mixture by weight, and metallic conductive material at a level of from approximately one-tenth percent (0.1%) to approximately two percent (2%) of the concrete mixture by weight, the metallic conductive material comprising steel fibers having a maximum size of one inch (1 inch), wherein the conductive concrete includes a metal layer.

6. The conductive concrete as recited in claim 5, further comprising water, wherein the water comprises from approximately thirteen percent (13%) to approximately sixteen percent (16%) of the concrete mixture by weight.

7. A method of forming an electromagnetic shielding concrete structure via a shotcrete application to provide effective electromagnetic shielding, the method comprising:

spraying, through a pressurized pneumatic device, a conductive concrete mixture onto a substrate to form a first sprayed layer, the conductive concrete mixture comprising:

cement at a level of approximately from fourteen percent (14%) to approximately eighteen percent (18%) of the conductive concrete mixture by weight, fine taconite aggregate material at a level of from approximately thirty-five percent (35%) to approximately fifty-five percent (55%) of the conductive concrete mixture by weight, respective particles of the fine taconite aggregate material having a maximum particle size of three-eighths inches (3/8 inches), coke breeze at a level of from approximately five percent (5%) to approximately thirty percent (30%) of the conductive concrete mixture by weight, and metallic conductive material at a level of from approximately one-tenth (0.1%) to approximately two percent (2%) of the conductive concrete mixture by weight, the metallic conductive material comprising steel fibers having a maximum size of one inch (1 inch); and positioning a metal layer in contact with the first sprayed layer.

8. The method as recited in claim 7, further comprising water, wherein the water comprises from approximately thirteen percent (13%) to approximately sixteen percent (16%) of the conductive concrete mixture by weight.

9. The method as recited in claim 7, further comprising:

testing one or more electromagnetic shielding characteristics of the first sprayed layer to determine whether the one or more electromagnetic shielding characteristics are below a threshold value.

10. The method as recited in claim 9, further comprising:

spraying an additional layer of conductive concrete mixture onto the first sprayed layer to form an additional sprayed layer of a concrete structure, and positioning an additional metal layer in contact with the additional layer of conductive concrete when one or more electromagnetic shielding characteristics are below the threshold value.

11. The method as recited in claim 7, wherein the metal layer is positioned directly adjacent to the first sprayed layer or a last sprayed layer.

12. The method as recited in claim 7 wherein the metal layer comprises at least one of copper, aluminum, galvanized steel, stainless steel, or wire mesh.

13. The method as recited in claim 7, the respective particles of the fine taconite aggregate material are characterized by a maximum particle size of one hundred and eighty-sevenths of an inch (0.187 inches).

14. The concrete structure as recited in claim 1, wherein:

the metal layer comprises at least two layers of woven wire mesh;

each of the woven wire mesh layers defines a plurality of apertures; and each of the plurality of apertures has a characteristic opening size of less than approximately a quarter inch (0.25 in.).

15. The method as recited in claim 7, wherein:

the metal layer comprises at least two layers of woven wire mesh;

each of the woven wire mesh layers defines a plurality of apertures; and each of the plurality of apertures has a characteristic opening size of less than approximately a quarter inch (0.25 in.).

* * * * *